United States Patent [19]
Itozaki et al.

[11] Patent Number: 5,182,256
[45] Date of Patent: Jan. 26, 1993

[54] PROCESS AND APPARATUS FOR PREPARING SUPERCONDUCTING THIN FILMS

[75] Inventors: Hideo Itozaki; Hisao Hattori; Keizo Harada; Kenjiro Higaki, all of Itami, Japan

[73] Assignee: Sumitomo Electric Industries, Ltd., Osaka, Japan

[21] Appl. No.: 718,883

[22] Filed: Jun. 21, 1991

[30] Foreign Application Priority Data

Jun. 21, 1990 [JP] Japan ................................ 2-163630
Jul. 10, 1990 [JP] Japan ................................ 2-182487

[51] Int. Cl.$^5$ ...................... H01L 39/24; C23C 14/35
[52] U.S. Cl. ................... 505/1; 204/192.24; 204/298.27; 204/298.29; 505/731
[58] Field of Search ............. 204/192.24, 298.23, 204/298.25, 298.26, 298.27, 298.29; 505/1, 731, 816

[56] References Cited

U.S. PATENT DOCUMENTS

| 4,842,704 | 6/1989 | Collins et al. | 204/192.24 |
| 4,965,248 | 10/1990 | Poppe et al. | 505/1 |
| 4,968,665 | 11/1990 | Ohuchi et al. | 505/1 |

FOREIGN PATENT DOCUMENTS

| 0398164 | 11/1990 | European Pat. Off. | 505/1 |
| 0398374 | 11/1990 | European Pat. Off. | 505/1 |
| 63-262459 | 10/1988 | Japan | 204/298.23 |
| 1147318 | 4/1969 | United Kingdom | 204/298.23 |

OTHER PUBLICATIONS

Simon R. W. et al; "Improvement of average film quality in $RBa_2Cu_3O_{7-x}$ Sputtered Films" IEEE Transactions on Magnetics, vol. 25, No. 2, Mar. 1989, N.Y., U.S. pp. 2433-2436.

Akutsu N. et al.; "Preparation of High-Tc Y-Ba-Cu-O Films by Three-Target Magnetron Sputtering" Japanese Journal of Applied Physics Letters, vol. 29, No. 4, Apr. 1990, Tokyo, JP, pp. 604-606.

Matsutani K. et al.; "Compositional Change of Sputtered $YBa_2Cu_3O_y$ Films with Substrate Location" Japanese Journal of Applied Physics, vol. 29, No. 1, Jan. 1990, Tokyo, JP pp. 79-80.

Primary Examiner—Aaron Weisstuch
Attorney, Agent, or Firm—Pennie & Edmonds

[57] ABSTRACT

A process for preparing a thin film of high-temperature compound oxide superconductor by a magnetron sputtering method. A substrate and a target are arranged in parallel with each other in a vacuum chamber and one of the substrate and the target is moved relative to and in parallel with the other while the thin film is formed by sputtering.

13 Claims, 4 Drawing Sheets

PROCESS AND APPARATUS FOR PREPARING SUPERCONDUCTING THIN FILMS

BACKGROUND OF THE INVENTION

1. Field of the Invention

The present invention relates to an improvement in a process for preparing superconducting thin films and an apparatus for carrying our the process. More particularly, the present invention relates to a process for preparing a thin film of high temperature compound oxide superconductor on a substrate by a magnetron sputtering method and an apparatus for carrying out the process.

DESCRIPTION OF THE RELATED ART

The high temperature compound oxide superconductor $(La,Sr)_2CuO_4$, which exhibits superconductivity at 30 K. was discovered in 1986 by Bednorz and Müller (*Z. Phys. B* 64, 1986, page 189). Another superconducting material, $YBa_2Cu_3O_{7-\delta}$, having a critical temperature of 90 K., was discovered in the United States of America, in 1987 by W. Chu et al. (*Physical Review Letters*, Vol. 58, No. 9, page 908). Maeda et al. discovered a so-called bismuth type superconducting material (*Japanese Journal of Applied Physics*, Vol. 27, No. 2 1987, pages 1209-1210). In this specification, the term "high-temperature compound oxide superconductor" means a compound oxide superconductor having a critical temperature above 30 K.

The high-temperature compound oxide superconductors were first obtained in the form of a sintered mass prepared by powder metallurgy. However, the sintered masses showed relatively poor superconducting properties, particularly lower critical densities (Jc). In order to increase the critical current density (Jc), a variety of thin film forming processes of these materials have been studied and now superconducting thin films of these compound oxides can be prepared by a variety of vapor deposition techniques such as vacuum-evaporation, sputtering, molecular beam epitaxy (MBE) etc. on single crystal substrates such as $SrTiO_3$, MgO, and the like. Remarkable improvements in the critical current densities of these compound oxides have been achieved in their thin films.

Recently, many studies for realizing electronic devices and circuits using the superconducting thin films have been initiated. In the research and development of such electronics devices, there is a strong demand to consistently provide thin films of high-temperature oxide superconductors whose quality is guaranteed. Further, there is a strong demand to provide a thin film of high-temperature oxide superconductor having a large area and uniformity.

However, the quality of superconducting thin films of high-temperature compound oxides prepared by a conventional technique such as sputtering is not constant because it is difficult to satisfy the two requirements of large area and uniformity or homogeneousness in quality. For this reason, it is not easy to fabricate electronics devices and/or circuits on a single thin film.

Also, productivity is very poor because the film forming operation on substrates must be conducted one by one.

Therefore, an object of the present invention is to solve the above described problems and to provide an effective process for preparing uniform and homogeneous thin films of high-temperature compound oxide superconductors on substrates by a magnetron sputtering method and to provide an apparatus for carrying out the process.

SUMMARY OF THE INVENTION

The present invention provides a process for preparing a thin film of a high-temperature compound oxide superconductor on a substrate by a magnetron sputtering method, characterized in that a substrate and a target are arranged parallel with each other in a vacuum chamber and one of the substrate and the target are moved relative to and in parallel with the other while the thin film is formed by sputtering.

The present invention also provides a magnetron sputtering apparatus for preparing a thin film of high-temperature compound oxide superconductor on a substrate, having a target holder on which a target is secured and a substrate holder on which a substrate is secured in a vacuum chamber, characterized in that the apparatus further has a means for moving one of the substrate and the target relative to and in parallel with the other while the thin film is formed by sputtering.

The substrate and the target are usually arranged horizontally but may be arranged vertically or in inclined positions.

The moving speed of the substrate relative to the target can be changed in a wide range depending on the dimensions of the substrate. For example, the moving speed can be selected in a range between several millimeters per second and several tens of millimeters per second.

In a variation of the present invention, a plurality of targets are arranged in a line along which a plurality of substrates are advanced successively. In this case, a plurality of substrates are advanced successively by a conveyor.

In the sputtering method, particles sputtered from the target have different energies and are distributed in a pattern. Therefore, when a thin film of high-temperature compound oxide superconductor is prepared by the sputtering method, it is believed that the surface of the substrate must be positioned at a predetermined location relative to the substrate because sputtering conditions for preparing such thin film are limited in relatively narrow ranges.

The present inventors, however, found that it is not necessary to maintain constant conditions throughout the sputtering operation. In other words, if predetermined conditions which contribute to formation of a superconducting thin film are satisfied in a predetermined time duration of the sputtering operation, the resulting thin film shows effective superconducting properties. The present invention was completed on the basis of this finding.

In the conventional sputtering technique, a substrate is located at a fixed position which is estimated to be the most effective zone to produce a superconducting thin film. However, contrary to expectation, the resulting thin film showed uneven and inhomogeneous quality due to the distribution pattern of sputtered particles.

According to the present invention, the substrate is moved or travelled relative to the target during the sputtering operation, so that the whole surface of the substrate passes at least one time through a predetermined zone of sputtered particles which is effective to produce a superconducting thin film. The thin film obtained thereby shows uniform quality substantially over all the surface. By adopting the process according to the present invention, a plurality of thin films can be prepared continuously in a single chamber.

The process according to the present invention is applicable to any known high-temperature compound oxide superconductor, including (La, Sr)$_2$CuO$_4$; the Y-Ba-Cu-O system, such as Y$_1$Ba$_2$Cu$_3$O$_{7-\delta}$ ($\delta$ is $\pm 1$); the Bi-Sr-Ca-CU-O system, such as Bi$_2$Sr$_2$Ca$_2$Cu$_3$O$_x$ (x=about 10); and the Tl-Ba-Ca-Cu-O system, such as Tl$_2$Ba$_2$Ca$_2$Cu$_3$O$_x$ (x=about 10).

The material of the substrate is not limited but is preferably a single crystal oxide such as MgO, SrTiO$_3$, LaAlO$_3$, LaGaO$_3$, and yttrium stabilized zirconia (YSZ).

The magnetron sputtering method used in the present invention is itself well-known. In the present invention, the following operational conditions are preferably used:

| | |
|---|---|
| Gas pressure during sputtering | 0.01 to 1 Torr |
| Substrate temperature | 550 to 750° C. |
| Power supplied during sputtering | 3 to 8 W/cm$^3$ |

Outside these operational conditions, superconducting properties often drop sharply or may not be exhibited.

The following advantages are obtained by the present invention:
1. Thin films of high-temperature compound oxide superconductor having uniform or homogeneous quality can be produced.
2. A plurality of thin films of high-temperature compound oxide superconductor can be produced continuously and effectively.

DESCRIPTION OF THE PREFERRED EMBODIMENTS

Now, the present invention will be described with reference to the appended drawings.

Figure 1:
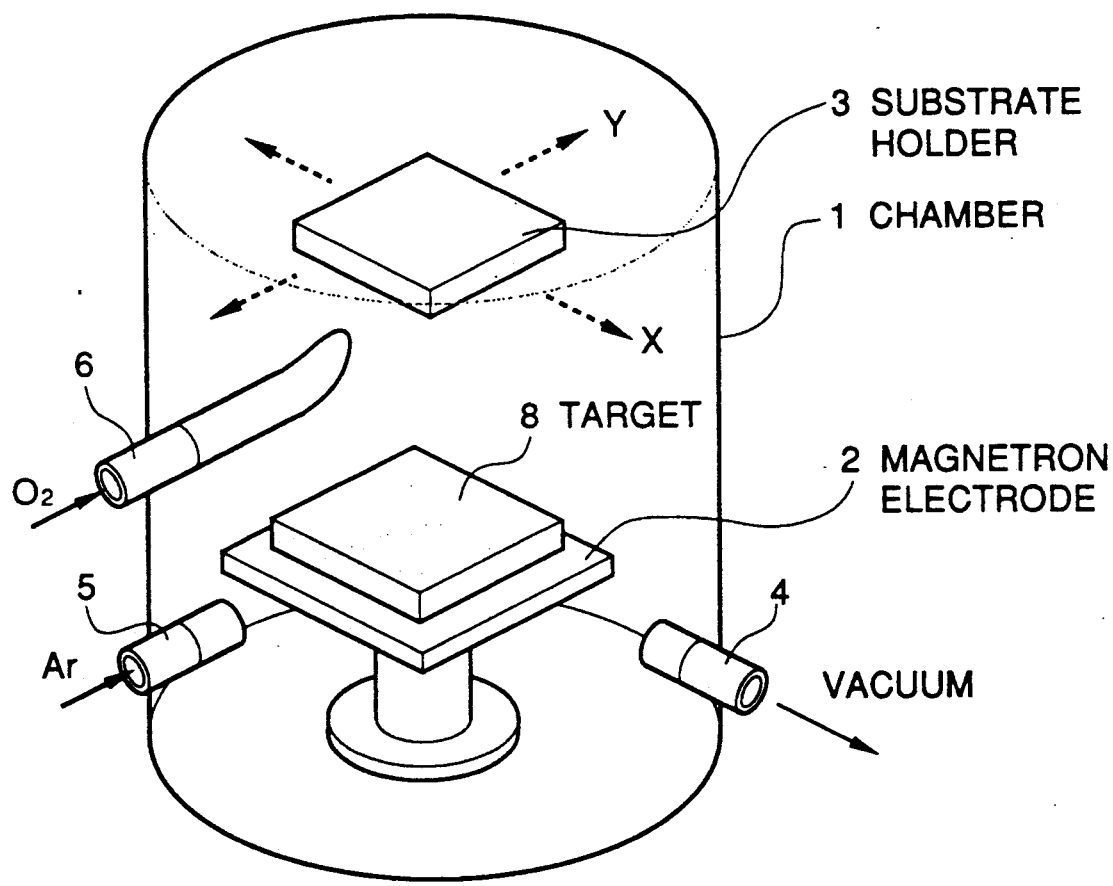
FIG. 1 is an illustrative view of an apparatus which can be used for carrying out the present invention.

FIG. 1 is an illustrative view of an apparatus which can be used for carrying out the process according to the present invention. The apparatus has a vacuum chamber 1. In the vacuum chamber 1, a magnetron electrode 2 and a substrate holder 3 having a heater (not shown) are arranged. A target 8 is secured on the target holder 2. A substrate (not shown) is secured on a lower side of the substrate holder 3 which can be moved reciprocally along two directions X, Y, which are perpendicular to each other, by means of an X-Y stage (not shown). The vacuum chamber 1 is provided with an evacuation port 4 for creating a vacuum in the chamber 1, a gas inlet port 5 for introducing sputtering gas, and an oxygen feed port 6 for supplying oxygen gas to a nozzle (not shown) through which oxygen gas is supplied in the vicinity of the surface of a substrate supported on the substrate holder 3.

Figure 2:
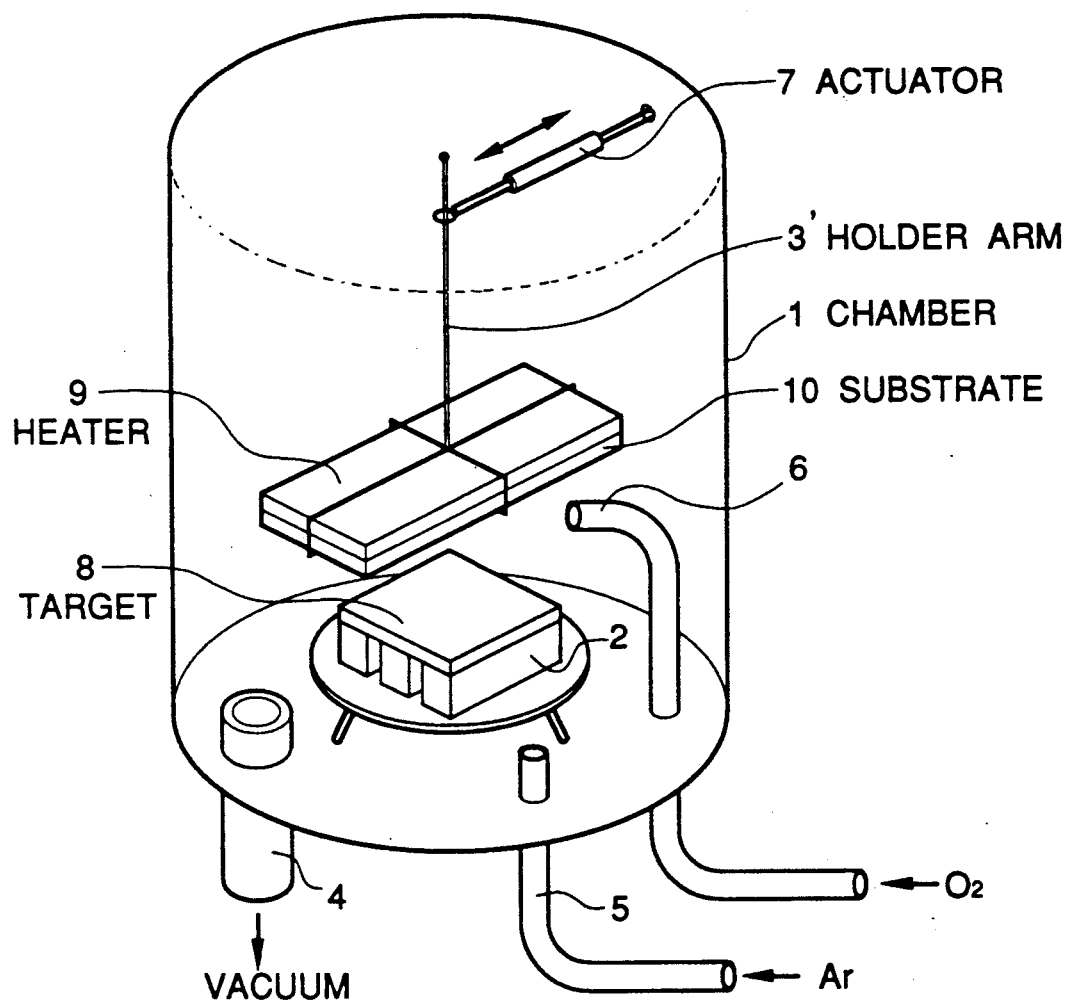
FIG. 2 is an illustrative view of another apparatus which can be used for carrying out the present invention.

FIG. 2 illustrates another apparatus which can be used for carrying out the present invention. FIG. 2 is similar to FIG. 1 except for showing a mechanism for moving the substrate. In FIG. 2, a substrate 10 is illustrated as an assembly with a heater 9 which is suspended from a substrate holder arm 3' which can be moved by an actuator 7. An end of the actuator 7 is connected to the substrate holder arm 3' and another end thereof is secured to the vacuum chamber 1. When the actuator 7 is driven by a signal from the outside of the chamber 1, the substrate holder arm 3' is moved so that the substrate 10 is driven in a substantially horizontal plane.

In operation, the target 8 is secured on the magnetron electrode 2 and the substrate (not shown) is secured on the substrate holder 3 (FIG. 1) or the assembly of substrate 10/heater 9 is suspended on the substrate holder arm 3' (FIG. 2). Then, the vacuum chamber 1 is evacuated and an inert gas such as argon is introduced into the vacuum chamber 1. The heater is energized to elevate the temperature of the substrate, the magnetron electrode is energized and oxygen gas is supplied continuously through the oxygen feed nozzle 6 onto the substrate to start the sputtering operation. During the sputtering, particles sputtered from the target arrive at the substrate and deposit thereon in an oxygen containing atmosphere.

Figure 5:
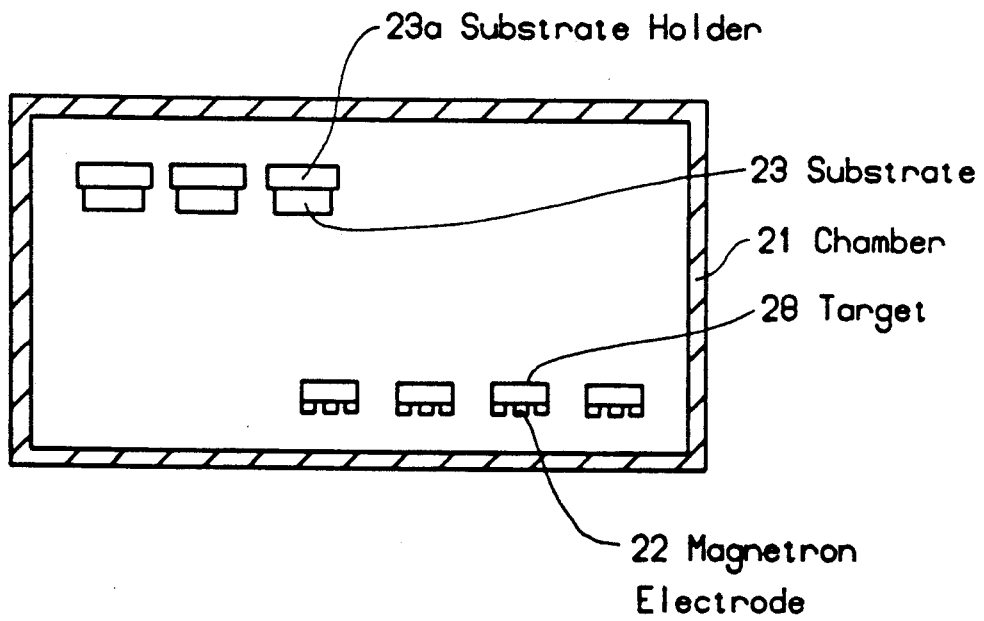
FIG. 5 is an illustrative view of still another apparatus for carrying out a continuous process of the present invention.

FIG. 5 illustrates an apparatus for carrying out the process of the present invention continuously. In FIG. 5, a plurality of magnetron electrodes 22 are arranged along a line and a plurality of substrate holders 23a travel horizontally over the magnetron electrodes 22 successively.

In operation, each target 28 is secured to a respective magnetron electrode 22 while each substrate is secured to a respective substrate holder 23a. Then the vacuum chamber is evacuated and an inert gas such as argon is introduced into the vacuum chamber 1. The heaters in the substrate holders 23a and the magnetron electrodes 22 are energized. The substrates 23 supported on each substrate holder 23a are advanced over a series of the magnetron electrodes 22 successively, so that the substrates 23 pass through a plasma produced by the magnetron electrodes 22. A thin film of oxide superconductor can be deposited in one pass. If necessary, the substrates 23 may be moved reciprocally. In a variation, a plurality of thin films can be produced continuously by feeding and removing substrates 23/substrate 23a holders from the vacuum chamber 21.

Now, the present invention will be described with reference to Examples, but the scope of the present invention should not be limited thereto.

EXAMPLE 1

Two Samples 1 and 2 of superconducting thin film having the same composition of Y$_1$Ba$_2$Cu$_3$O$_{7-\delta}$ ($\delta$ is $\pm 1$) were deposited on the (100) plane of a MgO single crystal (20×20 mm) by a substrate magnetron sputtering method using the apparatus shown in FIG. 1.

Sample 1 was moved reciprocally by an X-Y stage (not shown) along both the X and Y directions (FIG. 1) in parallel with the surface of a target 8 at a speed of 5 mm/sec and at a stroke of $\pm 20$ mm during magnetron sputtering. At the end of one cycle, the substrate was returned to its original position. The substrate was moved along the X-direction and along the Y-direction alternately.

Sample 2 (a comparative example) was not moved but was fixed in such manner that the substrate was centered with the target.

The magnetron electrode in both examples had a diameter of 4 inches. The main operational conditions used in the magnetron sputtering are summarized in Table 1:

TABLE 1

| | |
|---|---|
| Target Composition (atomic ratio) | Y:Ba:Cu = 1:2.2:4 |
| Sputtering Gas | Ar + $O_2$ |
| $O_2$/(Ar + $O_2$) | 20% (volume ratio) |
| Gas Pressure | 0.08 (Torr) |
| Substrate Temperature | 680 (°C.) |
| Electric Power Applied | 200 (W), 2.5 (W/cm$^2$) |
| Film Thickness | 4000 (Å) |

Figure 3:
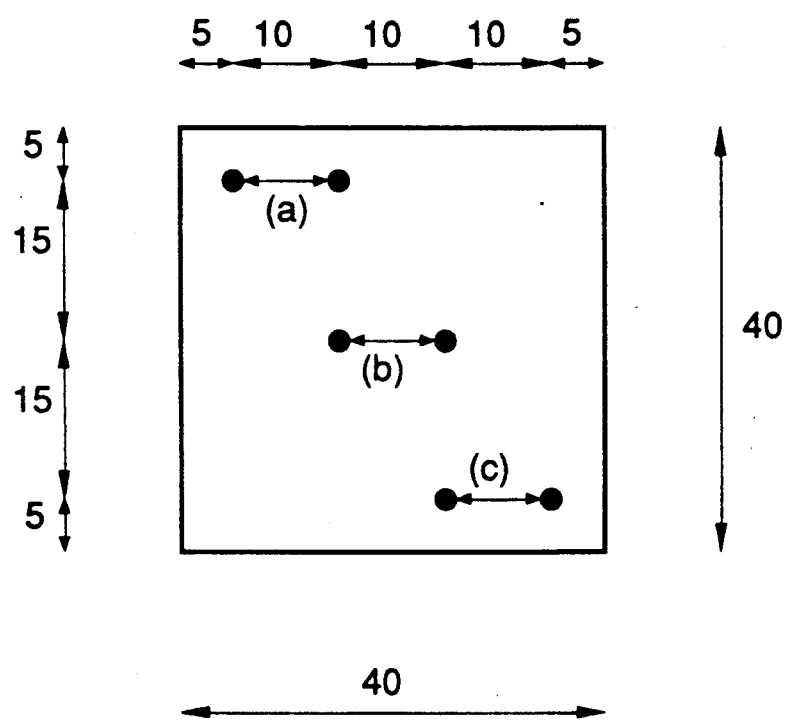
FIG. 3 is a plane view of a thin film prepared in an Example of the present invention and shows locations where superconducting properties were determined.

Superconducting properties (Tc and Jc) were determined at different positions on the obtained thin film. The results were summarized in Table 2. Measurement positions (a to c) are indicated in FIG. 3. Length is expressed by millimeters.

TABLE 2

| | SAMPLE 1 (Invention) | | SAMPLE 2 (Comparative) | |
|---|---|---|---|---|
| Measurement Position | Critical Temperature (K) | Critical Current Density (A/cm$^2$) | Critical Temperature (K) | Critical Current Density (A/cm$^2$) |
| a | 89 | 3.2 × 10$^6$ | 53 | — |
| b | 88 | 2.8 × 10$^6$ | 88 | 3.1 × 10$^6$ |
| c | 87 | 1.9 × 10$^6$ | 41 | |

[NOTE]:
Critical Temperature (Tc) indicated the temperature at which the electric resistance of the sample falls below the measurement limit.
Critical Current Density (Jc) indicated the current density at 77K.

The results reveal that the quality of the thin film of compound oxide prepared by the method of the invention (Sample 1) does not depend on the location measured and a high-quality thin film of compound oxide is prepared over the entire substrate.

EXAMPLE 2

Two Samples 1 and 2 of superconducting thin film having the same composition of $Y_1Ba_2Cu_3O_{7-\delta}$ ($\delta$ is ±1) were deposited on the (100) plane of a rectangular MgO single crystal (20×40 mm) substrate by a magnetron sputtering method using the apparatus shown in FIG. 2.

Sample 1 was moved by actuating the actuator 7, while Sample 2 (a comparative example) was not moved.

The main operational conditions used in the magnetron sputtering are summarized in Table 2:

TABLE 2

| | |
|---|---|
| Target Composition (atomic ratio) | Y:Ba:Cu = 1:2:4 |
| Sputtering Gas | Ar + $O_2$ |
| $O_2$/(Ar + $O_2$) | 20% (volume ratio) |
| Gas Pressure | 0.05 (Torr) |
| Substrate Temperature | 600 (°C.) |
| Electric Power Applied | 50 (W) |
| Film Thickness | about 3000 (Å) |
| Substrate-Target Distance | 50 (mm) |
| Substrate Displacement | 20 (mm) |
| Moving speed | 5 (mm/sec) |

Figure 4:
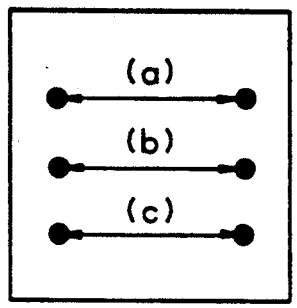
FIG. 4 is another plane view which is similar to FIG. 3 and which shows locations where superconducting properties were determined in another Example of the present invention.

Superconducting properties (Tc and Jc) were determined at different positions on the obtained thin film. The results are summarized in Table 4. Measurement positions (a to c) are indicated in FIG. 4.

TABLE 4

| | SAMPLE 1 (Invention) | | SAMPLE 2 (Comparative) | |
|---|---|---|---|---|
| Measurement Position | Critical Temperature (K) | Film Thickness (Å) | Critical Temperature (K) | Film Thickness (Å) |
| a | 85 | 3000 | 80 | 2200 |
| b | 85 | 3000 | 85 | 3000 |
| c | 85 | 3000 | 80 | 2200 |

The results reveal that the quality of thin film of compound oxide prepared by the method of the invention (sample 1) does not depend on the location measured and a high-quality thin film of compound oxide is prepared over the entire substrate.

We claim:

1. A process for preparing a thin film of high-temperature compound oxide superconductor on a substrate by a magnetron sputtering method, characterized in that the substrate and a sputtering target are arranged in parallel with each other in a vacuum chamber and one of the substrate and the target is moved reciprocally along two mutually perpendicular directions X, Y, and in parallel with the other while the thin film is formed by sputtering.

2. The process set forth in claim 1 wherein said substrate and said target are arranged horizontally.

3. The process set forth in claim 1 wherein said substrate is moved relative to said target at a moving speed selected in a range between several millimeters per second and several tens of millimeters per second.

4. The process set forth in claim 1 wherein said high-temperature compound oxide superconductor is of $(La,Sr)_2CuO_4$, the Y-Ba-Cu-O system, the Bi-Sr-Ca-Cu-O system, or the Tl-Ba-Ca-Cu-O system.

5. The process set forth in claim 1 wherein the substrate is a single crystal substrate of MgO, $SrTiO_3$, $LaAlO_3$, $LaGaO_3$, or yttrium stabilized zirconia (YSZ).

6. The process set forth in claim 1 wherein the gas pressure during sputtering is within a range of 0.01 Torr and 1 Torr.

7. The process set forth in claim 1 wherein the substrate temperature during sputtering is selected in a range of 550° to 750° C.

8. The process set forth in claim 1 wherein the power supplied to the target during sputtering is selected in a range of 3 to 8 W/cm$^2$.

9. A magnetron sputtering apparatus for preparing a thin film of high-temperature compound oxide superconductor on a substrate, having a target holder on which a target is adapted to be secured and a substrate holder on which a substrate is adapted to be secured in a vacuum chamber, characterized in that the apparatus further has a means for moving one of the substrate and the target reciprocally along two mutually perpendicular directions X, Y, and in parallel with the other (during) while the thin film is formed by sputtering.

10. The apparatus set forth in claim 9 including an oxygen feed nozzle in the vicinity of said substrate.

11. The apparatus set forth in claim 9 wherein said means for moving one of the substrate and the target is an X-Y stage.

12. The apparatus set forth in claim 9 wherein said means for moving one of the substrate and the target is an actuator.

13. The apparatus set forth in claim 9 wherein said means for moving one of the substrate and the target is a conveyer which advances a plurality of substrates past a plurality of targets.

* * * * *